(12) United States Patent
Park

(10) Patent No.: US 7,880,290 B2
(45) Date of Patent: Feb. 1, 2011

(54) FLIP-CHIP PACKAGES ALLOWING REDUCED SIZE WITHOUT ELECTRICAL SHORTS AND METHODS OF MANUFACTURING THE SAME

(75) Inventor: Chan Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 425 days.

(21) Appl. No.: 12/003,562

(22) Filed: Dec. 28, 2007

(65) Prior Publication Data
US 2008/0157397 A1 Jul. 3, 2008

(30) Foreign Application Priority Data
Dec. 29, 2006 (KR) .................. 10-2006-0137916

(51) Int. Cl.
*H01L 23/48* (2006.01)
(52) U.S. Cl. .................. 257/696; 257/692; 257/690; 257/780; 257/734; 257/778
(58) Field of Classification Search .................. 257/778, 257/734, 737, 738, E23.001, 692, 690, 780
See application file for complete search history.

(56) References Cited

U.S. PATENT DOCUMENTS 5,897,326 A   4/1999   Eldridge et al.

7,059,047 B2 *   6/2006   Dozier et al. .................. 29/845
7,345,493 B2 *   3/2008   Khandros et al. ........... 324/754
2005/0017372 A1 *   1/2005   Lua et al. ..................... 257/778
2007/0181992 A1 *   8/2007   Lake .......................... 257/698
2009/0140442 A1 *   6/2009   Lin ............................. 257/778

FOREIGN PATENT DOCUMENTS

JP   09-260428   10/1997
JP   10-125729   5/1998

* cited by examiner

*Primary Examiner*—Thao X Le
*Assistant Examiner*—Thanh Y Tran
(74) *Attorney, Agent, or Firm*—Harness, Dickey, & Pierce, P.L.C.

(57) ABSTRACT

A flip-chip package may include: a semiconductor chip having first pads arranged substantially along a first direction; a substrate having second pads, arranged substantially in a zigzag form aligned with the first pads as a center line, and facing the semiconductor chip; and conductive bumps for electrically connecting the first pads to the second pads in a one-to-one relationship. Adjacent conductive bumps may extend in different directions. A method of manufacturing a flip-chip package may include: forming conductive bumps that extend along different directions on first pads of a semiconductor chip; and connecting second pads of a substrate to the conductive bumps in a one-to-one relationship. A method of manufacturing a flip-chip package may include: forming conductive bumps that extend along different directions on second pads of a substrate; and connecting first pads of a semiconductor chip to the conductive bumps in a one-to-one relationship.

25 Claims, 5 Drawing Sheets

FLIP-CHIP PACKAGES ALLOWING REDUCED SIZE WITHOUT ELECTRICAL SHORTS AND METHODS OF MANUFACTURING THE SAME

PRIORITY STATEMENT

This application claims priority from Korean Patent Application No. 10-2006-0137916, filed on Dec. 29, 2006, in the Korean Intellectual Property Office (KIPO), the entire contents of which are incorporated herein by reference.

BACKGROUND

1. Field

Example embodiments relate to flip-chip packages and methods of manufacturing the same. Also, example embodiments relate to flip-chip packages having a structure where a semiconductor chip faces a substrate, and methods of manufacturing the same.

2. Description of Related Art

Generally, a plurality of semiconductor chips may be formed by performing various semiconductor processes on a semiconductor substrate. Next, in order to mount the semiconductor chips on a printed circuit board (PCB), a semiconductor package may be formed by performing a packaging process on the semiconductor substrate. Conventional examples of the semiconductor package are disclosed in U.S. Pat. No. 5,897,326, Japanese Patent Laid-Open Publication Nos. 1997-260428 and 1998-125729, etc.

Examples of semiconductor packages may include a flip-chip package. In the flip-chip package, a semiconductor chip is arranged to be opposite to a substrate so that first pads of the semiconductor chip are electrically connected to second pads of the substrate one-to-one through conductive bumps. An underfill layer is formed between the semiconductor chip and the substrate so that the conductive bumps are protected from external shocks.

However, in the conventional flip-chip package, the second pads of the substrate are connected to the first pads of the semiconductor chip through the conductive bumps formed along a vertical direction. Due to this, a pitch between first pads of the semiconductor chip may be substantially the same as a pitch between the second pads of the substrate. As a result, because the pitch between the second pads of the substrate is very narrow, electrical shorts between the conductive bumps may frequently occur. In order to prevent these electrical shorts, the pitch between the second pads of the substrate is shortened. However, reducing the pitch has some limitations. Therefore, the electrical shorts may act as limitations in reducing the size of the substrate so that forming the flip-chip package having a fine pitch may be difficult.

SUMMARY

Example embodiments may provide flip-chip packages that are capable of preventing electrical shorts between conductive bumps without expanding the size of a substrate.

Example embodiments may provide methods of manufacturing the above-mentioned flip-chip packages.

According to example embodiments, a flip-chip package may include: a semiconductor chip having first pads arranged substantially along a first direction; a substrate having second pads, arranged substantially in a zigzag form aligned with the first pads as a center line, and facing the semiconductor chip; and/or conductive bumps for electrically connecting the first pads to the second pads in a one-to-one relationship. Adjacent conductive bumps may extend in different directions.

According to example embodiments, a method of manufacturing a flip-chip package may include: forming conductive bumps that extend along different directions on first pads of a semiconductor chip arranged substantially along a first direction; and/or connecting second pads of a substrate, arranged substantially in a zigzag form aligned with the first pads as a centerline, to the conductive bumps in a one-to-one relationship.

According to example embodiments, a method of manufacturing a flip-chip package may include: forming conductive bumps that extend along different directions on second pads of a substrate; and/or connecting first pads of a semiconductor chip, arranged substantially along a first direction, to the conductive bumps in a one-to-one relationship. The second pads may be arranged substantially in a zigzag form aligned with the first pads as a centerline.

BRIEF DESCRIPTION OF THE DRAWINGS

The above and/or other aspects and advantages will become more apparent and more readily appreciated from the following detailed description of example embodiments taken in conjunction with the accompanying drawings, in which.

DESCRIPTION OF EXAMPLE EMBODIMENTS

Figure 1:
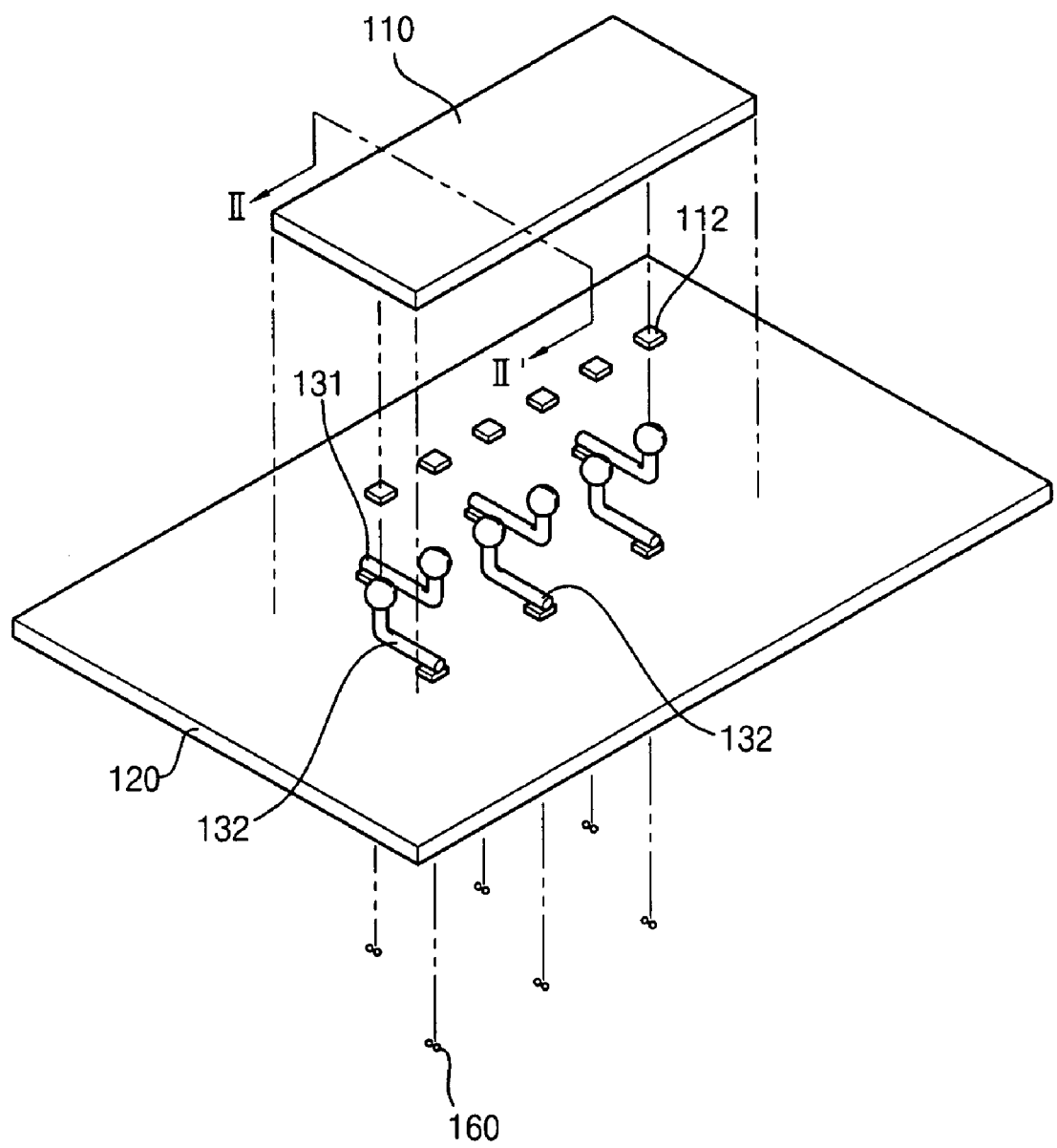
FIG. 1 is an exploded perspective view illustrating a flip-chip package according to example embodiments.

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element or layer is referred to as being "on," "connected to," "electrically connected to," or "coupled to" another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the figures. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 2:
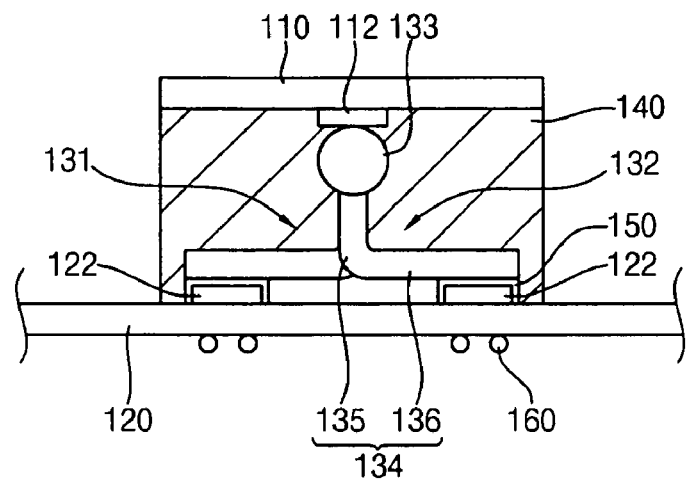
FIG. 2 is a cross-sectional view taken along a line II-II' in FIG. 1.
Figure 3:
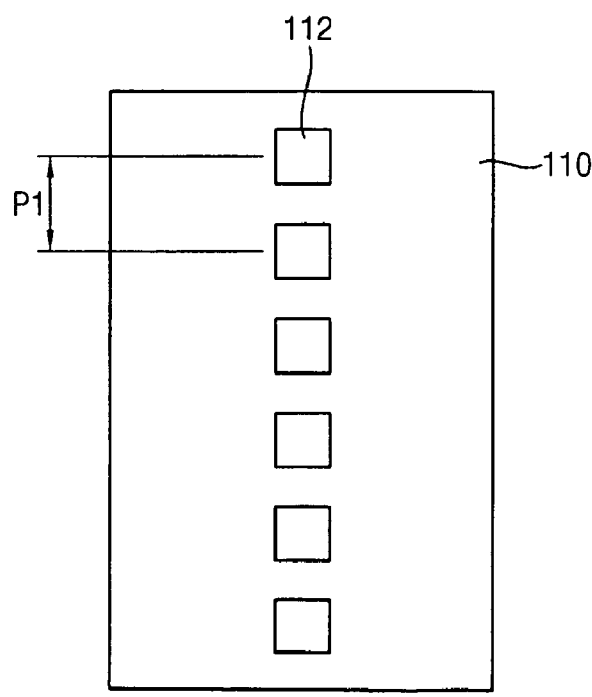
FIG. 3 is a bottom view illustrating a semiconductor chip in FIG. 1.
Figure 4:
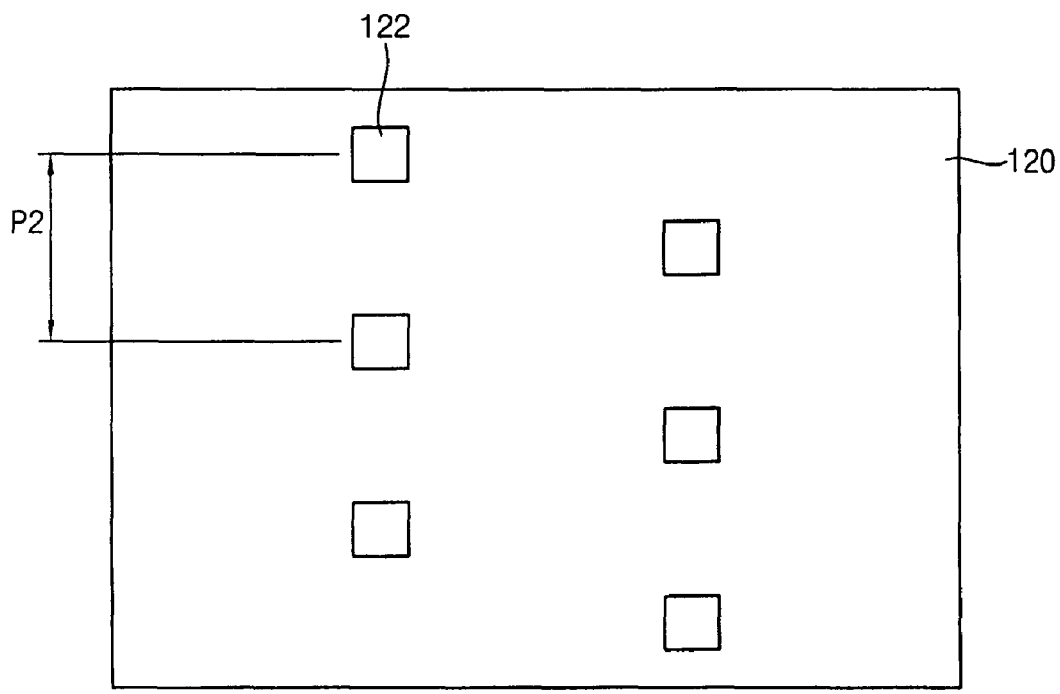
FIG. 4 is a plan view illustrating a substrate in FIG. 1.

FIG. 1 is an exploded perspective view illustrating a flip-chip package according to example embodiments, FIG. 2 is a cross-sectional view taken along a line II-II' in FIG. 1, FIG. 3 is a bottom view illustrating a semiconductor chip in FIG. 1, and FIG. 4 is a plan view illustrating a substrate in FIG. 1.

Referring to FIGS. 1 to 4, a flip-chip package 100 according to example embodiments may include a semiconductor chip 110, a substrate 120, first conductive bumps 131, second conductive bumps 132, an underfill layer 140, an adhesive layer 150, and/or external connecting terminals 160.

The semiconductor chip 110 may include a plurality of first pads 112. In example embodiments, the first pads 112 may be arranged on a lower face of the semiconductor chip 110. Further, the first pads 112 may be linearly arranged on a central portion of the lower face of the semiconductor chip 110 along a first direction. The first pads 112 may be arranged at intervals of a first pitch P1.

The substrate 120 may be provided under the semiconductor chip 110. The substrate 120 may include second pads 122 that have substantially the same quantity as the first pads 112. The second pads 122 may be arranged on a surface of the substrate 120. In example embodiments, the second pads 122 may be arranged in a zigzag form aligned with the first pads 112 as a centerline. That is, the second pads 122 may be arranged in the zigzag form at both sides of the first pads 112 so that the adjacent first pads 112 and second pads 122 are electrically connected to each other through the first conductive bumps 131 and/or the second conductive bumps 132. In example embodiments, the second pads 122 may be arranged along the first direction that is substantially parallel with an arranging direction of the first pads 112. Further, because the second pads 122 may be arranged at both sides of the first pads 112, a second pitch P2 between the second pads 122 may be about double the first pitch P1.

The first conductive bumps 131 and/or the second conductive bumps 132 may electrically connect, for example, adjacent first pads 112 and second pads 122 to each other. In example embodiments, the first conductive bump 131 may connect a first pad 112 to a second pad 122 positioned at a left side of the first pad 112. Therefore, the first conductive bump 131 may extend from the first pad 112 along a left direction and may make contact with the second pad 122. In contrast, the second conductive bump 132 may connect another first pad 112 adjacent to the above-mentioned first pad 112 to another second pad 122 positioned at a right side of the another first pad 112. Therefore, the second conductive bump 132 may extend from the another first pad 112 and may make contact with the another second pad 122. That is, the adjacent first conductive bumps 131 and second conductive bumps 132 may extend in different directions. In example embodiments, the adjacent first conductive bumps 131 and second conductive bumps 132 may extend in opposite directions. Therefore, electrical shorts between the adjacent first conductive bumps 131 and second conductive bumps 132 may be prevented. Moreover, because the second pitch P2 between the second pads 122 may be about double the first pitch P1, electrical shorts between the adjacent first conductive bumps 131 and second conductive bumps 132 may be prevented without expanding the size of the substrate 120.

Further, each of the first conductive bumps 131 and/or the second conductive bumps 132 may include a stud 133 and/or a tail 134. The studs 133 may be formed on the first pads 112. The tails 134 may extend from the studs 133 and/or may make contact with the second pads 122. The tails 134 may include, for example, a first portion 135 extending downward substantially vertically from the studs 133 and/or a second portion 136 extending substantially horizontally from the first portion 135 to contact the second pads 122. That is, the second portions 136 of each of first conductive bumps 131 and/or second conductive bumps 132 may extend along different and/or opposite directions. Therefore, stresses between the second pads 122 and the first conductive bumps 131 and/or the second conductive bumps 132 may be prevented by the second portion 136 curved along a substantially horizontal direction. Moreover, the curved second portion 136 may reduce a distance between the substrate 120 and the semiconductor chip 110 so that the flip-chip package 100 may be thinner.

Additionally, the adhesive layer 150 may be formed on the second pads 122. The adhesive layer 150 may enhance adhesion strength between the second pads 122, the first conductive bumps 131, and/or the second conductive bumps 132, that is, the second portions 136. In example embodiments, the adhesive layer 150 may include, for example, solder paste.

More than one second pad 122 may have, for example, adhesive layer 150. Adhesive layer 150 may include one or more layers of adhesive on a respective second pad 122 or pads 122. In addition or in the alternative, some second pads 122 may have a layer or layers of a first adhesive material, while some other second pads 122 may have a layer or layers of a second adhesive material. In each of these cases, second pads 122 have adhesive layers 150.

The underfill layer 140 may be formed between the semiconductor chip 110 and the substrate 120 to cover at least some of the first conductive bumps 131 and/or at least some of the second conductive bumps 132. The underfill layer 140 may protect the first conductive bumps 131 and/or the second conductive bumps 132 from external shocks. In example embodiments, the underfill layer 140 may include, for example, epoxy resin.

The external connecting terminals 160 may be mounted on the lower face of the substrate 120. The external connecting terminals 160 may be electrically connected with the second pads 122 arranged on the surface of the substrate 120. In example embodiments, the external connecting terminals 160 may include, for example, one or more solder balls.

According to example embodiments, because the second pads may be arranged in the zigzag form aligned with the first pads as the centerline, electrical shorts between the conductive bumps may be prevented without extending the size of the substrate. Therefore, the flip-chip packages 100 may have a fine pitch.

FIGS. 5 to 8 are cross-sectional views illustrating a method of manufacturing the flip-chip package in FIG. 2.

Figure 5:
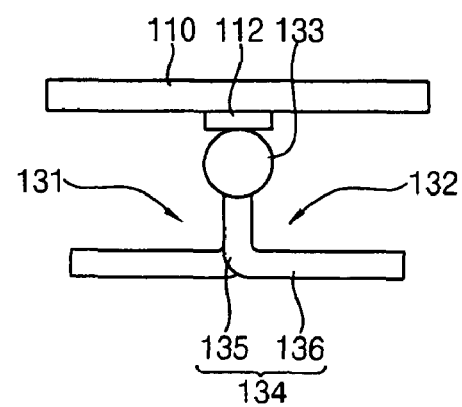
FIGS. 5 to 8 are cross-sectional views illustrating a method of manufacturing the flip-chip package in FIG. 2.

Referring to FIG. 5, the first conductive bumps 131 and/or the second conductive bumps 132 may be formed on the first pads 112 of the semiconductor chip 110. Here, the first conductive bump 131 may extend, for example, to the right from the first pad 112. In contrast, the second conductive bump 132 may extend, for example, to the left from another first pad 112 adjacent to the first pad 112.

The first conductive bumps 131 and/or the second conductive bumps 132 may be formed according to the following method. At first, a conductive material (not shown in the figures) may be coated on the first pad 112 from a capillary (not illustrated) to form the stud 133. The first portion 135 may then be formed along a substantially vertical direction from the stud 133 by flowing out the conductive material continuously from the capillary. Then, before the first portion 135 is hardened, the first portion 135 may be bent substantially horizontally to form the second portion 136.

Alternatively, the second portion 136 may be formed simultaneously with forming the first portion 135 by moving the capillary in the substantially horizontal direction.

Figure 6:
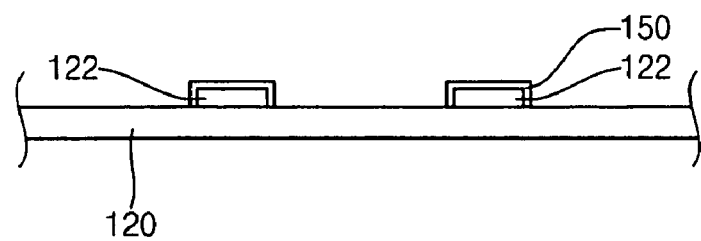

Referring to FIG. 6, the adhesive layer 150 may be formed on the second pads 122 of the substrate 120. Here, the second pads 122 may be arranged on the surface of the substrate 120 in the zigzag form aligned with the first pads 112 as the centerline.

Figure 7:
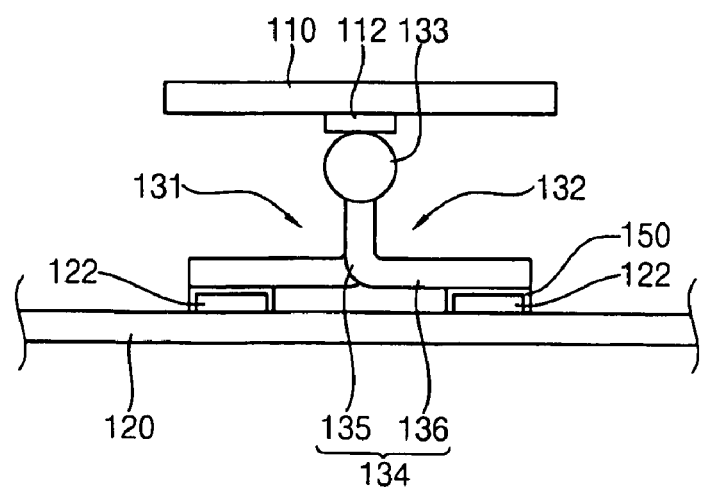

Referring to FIG. 7, lower portions of the first conductive bumps 131 and/or the second conductive bumps 132, that is, ends of the second portions 136 may be adhered to the second pads 122 using the adhesive layer 150. Here, because the second portion 136 may be curved along the substantially horizontal direction from the first portion 135, the stresses between the first conductive bumps 131 and the second pads 122 and/or the stresses between the second conductive bumps 132 and the second pads 122 may be reduced by the curved second portion 136. Further, because the first conductive bump 131 may be extended, for example, to the left and the second conductive bump 132 may be extended, for example, to the right, electrical shorts between the adjacent first conductive bumps 131 and second conductive bumps 132 may be prevented.

Figure 8:
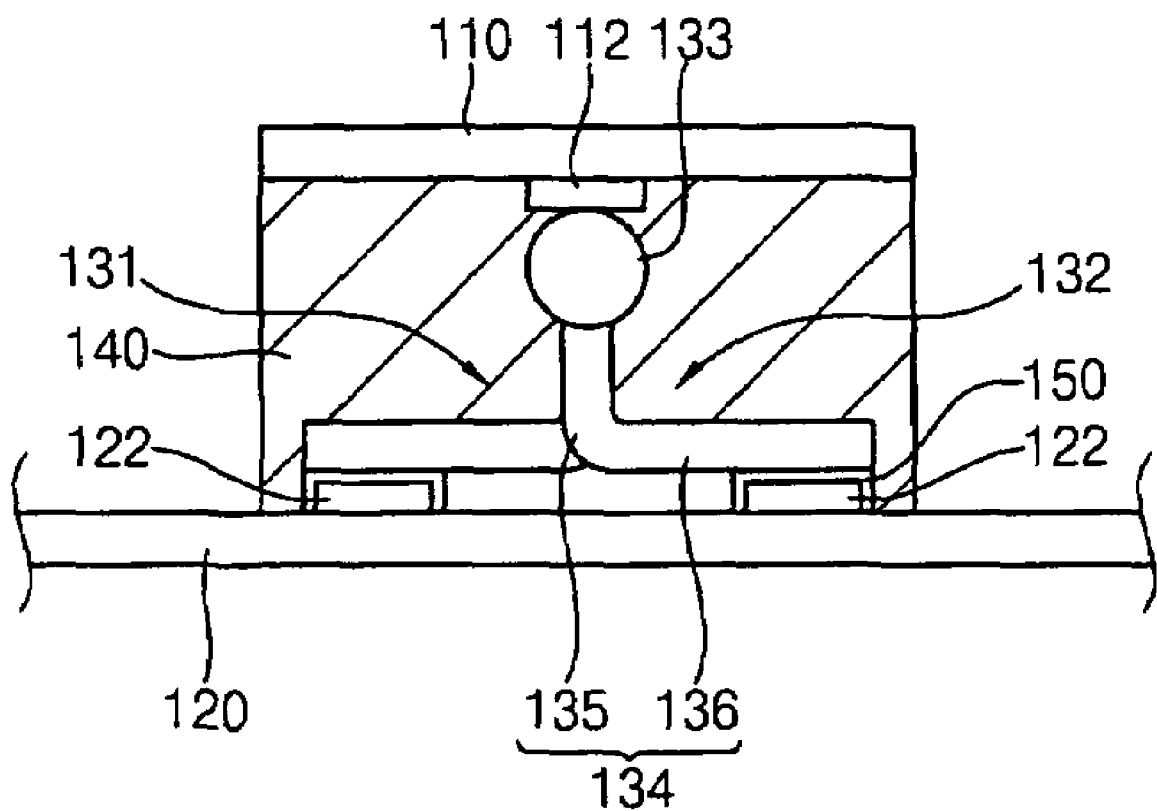

Referring to FIG. 8, the underfill layer 140 may be formed between the semiconductor chip 110 and the substrate 120 so that at least some of the first conductive bumps 131 and/or at least some of the second conductive bumps 132 may be covered with the underfill layer 140.

Thus, the method of manufacturing a flip-chip package may include: forming conductive bumps that extend along different directions on first pads of a semiconductor chip arranged substantially along a first direction; and/or connecting second pads of a substrate, arranged substantially in a zigzag form aligned with the first pads as a centerline, to the conductive bumps in a one-to-one relationship. In addition or in the alternative, the method of manufacturing a flip-chip package may include: forming conductive bumps that extend along different directions on second pads of a substrate; and/or connecting first pads of a semiconductor chip, arranged substantially along a first direction, to the conductive bumps in a one-to-one relationship. The second pads may be arranged substantially in a zigzag form aligned with the first pads as a centerline.

Referring to FIG. 2, the solder balls as the external connecting terminals 160 may be mounted on the lower face of the substrate 120 so that the flip-chip package 100 according to example embodiments may be completed.

According to example embodiments, second pads of a substrate may be arranged in a zigzag form aligned by first pads of a semiconductor chip as a centerline, and/or adjacent conductive bumps may be extended in different directions. Therefore, electrical shorts between the adjacent conductive bumps may be prevented. As a result, the size of the substrate need not be expanded to prevent the electrical shorts so that a flip-chip package may have a fine pitch.

While example embodiments have been particularly shown and described, it will be understood by those of ordinary skill in the art that various changes in form and details may be made therein without departing from the spirit and scope of the present invention as defined by the following claims.

What is claimed is:

1. A flip-chip package, comprising:
   a semiconductor chip having first pads arranged substantially along a first direction;
   a substrate having second pads, arranged substantially in a zigzag form aligned with the first pads as a center line, and facing the semiconductor chip; and
   conductive bumps for electrically connecting the first pads to the second pads in a one-to-one relationship;
   wherein each conductive bump that has only one adjacent conductive bump extends in a different direction than the adjacent conductive bump, and
   wherein each conductive bump that has two adjacent conductive bumps extends in a different direction than the adjacent conductive bumps.

2. The flip-chip package of claim 1, wherein each conductive bump that has only one adjacent conductive bump extends in a direction substantially opposite to a direction in which the adjacent conductive bump extends, and
   wherein each conductive bump that has two adjacent conductive bumps extends in a direction substantially opposite to a direction in which the adjacent conductive bumps extend.

3. The flip-chip package of claim 1, wherein the second pads are arranged substantially along the first direction.

4. The flip-chip package of claim 1, wherein the first pads have a first pitch,
   wherein the second pads have a second pitch, and
   wherein the second pitch is about double the first pitch.

5. The flip-chip package of claim 1, wherein each of the conductive bumps comprises:
   a stud making contact with a respective first pad; and
   a tail extending from the stud and making contact with a respective second pad.

6. The flip-chip package of claim 5, wherein the tail comprises:
   a first portion extending along a substantially vertical direction from the stud; and
   a second portion extending along a substantially horizontal direction from the first portion and making contact with the respective second pad.

7. The flip-chip package of claim 1, further comprising:
adhesive layers formed between the conductive bumps and the second pads.

8. The flip-chip package of claim 7, wherein at least some of the adhesive layers comprise solder paste.

9. The flip-chip package of claim 1, further comprising:
an underfill layer formed between the substrate and the semiconductor chip to cover at least some of the conductive bumps.

10. The flip-chip package of claim 1, further comprising: external connecting terminals mounted on the substrate.

11. The flip-chip package of claim 1, further comprising:
adhesive layers formed between the conductive bumps and the second pads;
an underfill layer formed between the substrate and the semiconductor chip to cover at least some of the conductive bumps; and
external connecting terminals mounted on the substrate.

12. The flip-chip package of claim 11, wherein the first pads have a first pitch,
wherein the second pads have a second pitch, and
wherein the second pitch is about double the first pitch.

13. The flip-chip package of claim 11, wherein each of the conductive bumps comprises:
a stud making contact with a respective first pad; and
a tail extending from the stud and making contact with a respective second pad;
wherein the tail comprises:
a first portion extending along a substantially vertical direction from the stud; and
a second portion extending along a substantially horizontal direction from the first portion and making contact with the respective second pad.

14. A method of manufacturing a flip-chip package, comprising:
forming conductive bumps that extend along different directions on first pads of a semiconductor chip arranged substantially along a first direction; and
connecting second pads of a substrate, arranged substantially in a zigzag form aligned with the first pads as a centerline, to the conductive bumps in a one-to-one relationship,
wherein each conductive bump that has only one adjacent conductive bump extends in a different direction than the adjacent conductive bump, and
wherein each conductive bump that has two adjacent conductive bumps extends in a different direction than the adjacent conductive bumps.

15. The method of claim 14, wherein forming the conductive bumps comprises:
forming a stud on each first pad; and
forming a tail that extends from each stud.

16. The method of claim 15, wherein forming the tail comprises:
forming a first portion along a substantially vertical direction from the stud; and
forming a second portion by bending part of the first portion along a substantially horizontal direction.

17. The method of claim 15, wherein forming the tail comprises:
forming a first portion along a substantially vertical direction from the stud; and
forming a second portion by changing a direction of formation from the substantially vertical direction to a substantially horizontal direction.

18. The method of claim 14, further comprising:
forming adhesive layers between the conductive bumps and the second pads.

19. The method of claim 14, further comprising:
forming an underfill layer between the substrate and the semiconductor chip to cover at least some of the conductive bumps.

20. The method of claim 14, further comprising:
mounting external connecting terminals on the substrate.

21. The method of claim 14, wherein connecting the second pads comprises:
forming adhesive layers on the second pads; and
connecting the second pads to the conductive bumps in a one-to-one relationship using the adhesive layers.

22. The method of claim 21, further comprising:
forming an underfill layer between the substrate and the semiconductor chip to cover at least some of the conductive bumps; and
mounting external connecting terminals on the substrate.

23. The method of claim 21, wherein the first pads have a first pitch,
wherein the second pads have a second pitch, and
wherein the second pitch is about double the first pitch.

24. The method of claim 21, wherein forming the conductive bumps comprises:
forming a stud on each first pad;
extending a first portion along a substantially vertical direction from the stud; and
extending a second portion along a substantially horizontal direction from the first portion.

25. A method of manufacturing a flip-chip package, comprising:
forming conductive bumps that extend along different directions on second pads of a substrate; and
connecting first pads of a semiconductor chip, arranged substantially along a first direction, to the conductive bumps in a one-to-one relationship;
wherein the second pads are arranged substantially in a zigzag form aligned with the first pads as a centerline,
wherein each conductive bump that has only one adjacent conductive bump extends in a different direction than the adjacent conductive bump, and
wherein each conductive bump that has two adjacent conductive bumps extends in a different direction than the adjacent conductive bumps.

* * * * *